United States Patent [19]

Mao

[11] Patent Number: 5,218,237

[45] Date of Patent: Jun. 8, 1993

[54] CIRCUIT FORMING OUTPUT PULSE A SELECTED DELAY AFTER INITIATING PULSE

[75] Inventor: Robert S. Mao, Hsinchu, Taiwan

[73] Assignee: Etron Technology Inc., Hsinchu, Taiwan

[21] Appl. No.: 815,746

[22] Filed: Jan. 2, 1992

[51] Int. Cl.$^5$ .................. H03K 3/017; H03K 5/159
[52] U.S. Cl. ................................. 307/265; 307/590;
307/597; 307/601; 307/602; 307/603; 307/605;
328/55
[58] Field of Search ............... 307/265, 509, 597, 603,
307/605, 601, 602; 328/55, 58, 61

[56] References Cited

U.S. PATENT DOCUMENTS

| | | | |
|---|---|---|---|
| 4,675,546 | 7/1987 | Shaw | 307/265 |
| 4,767,947 | 8/1988 | Shah | 307/265 |
| 4,785,262 | 11/1988 | Ryu et al. | 307/265 |
| 4,797,573 | 1/1989 | Ishimoto | 307/265 |
| 5,008,563 | 4/1991 | Kenney et al. | 307/265 |

*Primary Examiner*—William L. Sikes
*Assistant Examiner*—Trong Quang Phan
*Attorney, Agent, or Firm*—George O. Saile

[57] ABSTRACT

A circuit forms a narrow output pulse by charging a first and a second node during the relatively long interval between output pulses. When an initiating pulse is received, both nodes are discharged rapidly. An inverting amplifier which forms the circuit output has its input connected to the second node, and it produces the output pulse as the complement of the voltage level at this node. Time delay elements establish the width of the output pulse. Just before the time for the fall of the output pulse, the first and second nodes are isolated and the second node is then charged to a voltage to turn off the inverting amplifier and drop the output pulse. The initiating pulse is applied to the discharging circuit through a selected one of two paths that have different delays. The circuit is useful in the support circuits for an FET memory of the type that requires a narrow pulse, Row Address Interlock, following an initiating pulse Row Address Set by a short delay in normal memory operations and by a longer delay in memory refresh operation.

15 Claims, 2 Drawing Sheets

Normal Mode

Refresh Mode

CIRCUIT FORMING OUTPUT PULSE A SELECTED DELAY AFTER INITIATING PULSE

FIELD OF THE INVENTION

This invention relates to pulse forming circuits and is particularly useful in the support circuits of a dynamic memory which requires a refresh operation.

INTRODUCTION

It will simplify the description of this pulse forming circuit to use the names of specific pulses that appear in the preferred application, a dynamic memory having a single FET as a storage cell and requiring a refresh operation to maintain the charge of the cell. The circuit provides a very narrow pulse that is particularly useful as a timing pulse called RAI (row address interlock). It is a general object in this art to provide fast rise and fall times for the RAI pulse. RAI rises a selected time delay after a timing signal called RAS (row address set). The selected time delay is short for normal memory operations (fetch and store) and is longer for a memory refresh operation. The memory operating mode is defined by a signal RSH (refresh) for refresh operations and its complement $\overline{RSH}$ for normal operations. When the preferred circuit has been described, it will be easy to see that the invention will be useful in other applications.

SUMMARY OF THE INVENTION

During the relatively long periods between RAI pulses, components charge a first and a second node of the circuit. When the initiating pulse, RAS, is received, other components discharge both nodes rapidly. An inverting amplifier which forms the circuit output has its input connected to the second node, and it produces the output pulse as the complement of the level at this node. The inverting amplifier raises RAI when the node is discharged.

A time delay element and associated components then isolate the second node from the first node (and the components of the discharging circuit), and they then raise the level at the second node to charge the second node and thereby turn on the inverting amplified and form the trailing edge of the pulse RAI.

The initiating pulse, RAS, is applied to the discharging circuit through a selected one of two paths that have different delays. The path with the shorter delay controls the rise of RAI for normal memory operations and the path with the longer delay controls the rise of RAI for memory refresh operations.

THE DRAWING

THE PREFERRED EMBODIMENT

Circuit output and inputs

Figure 1:
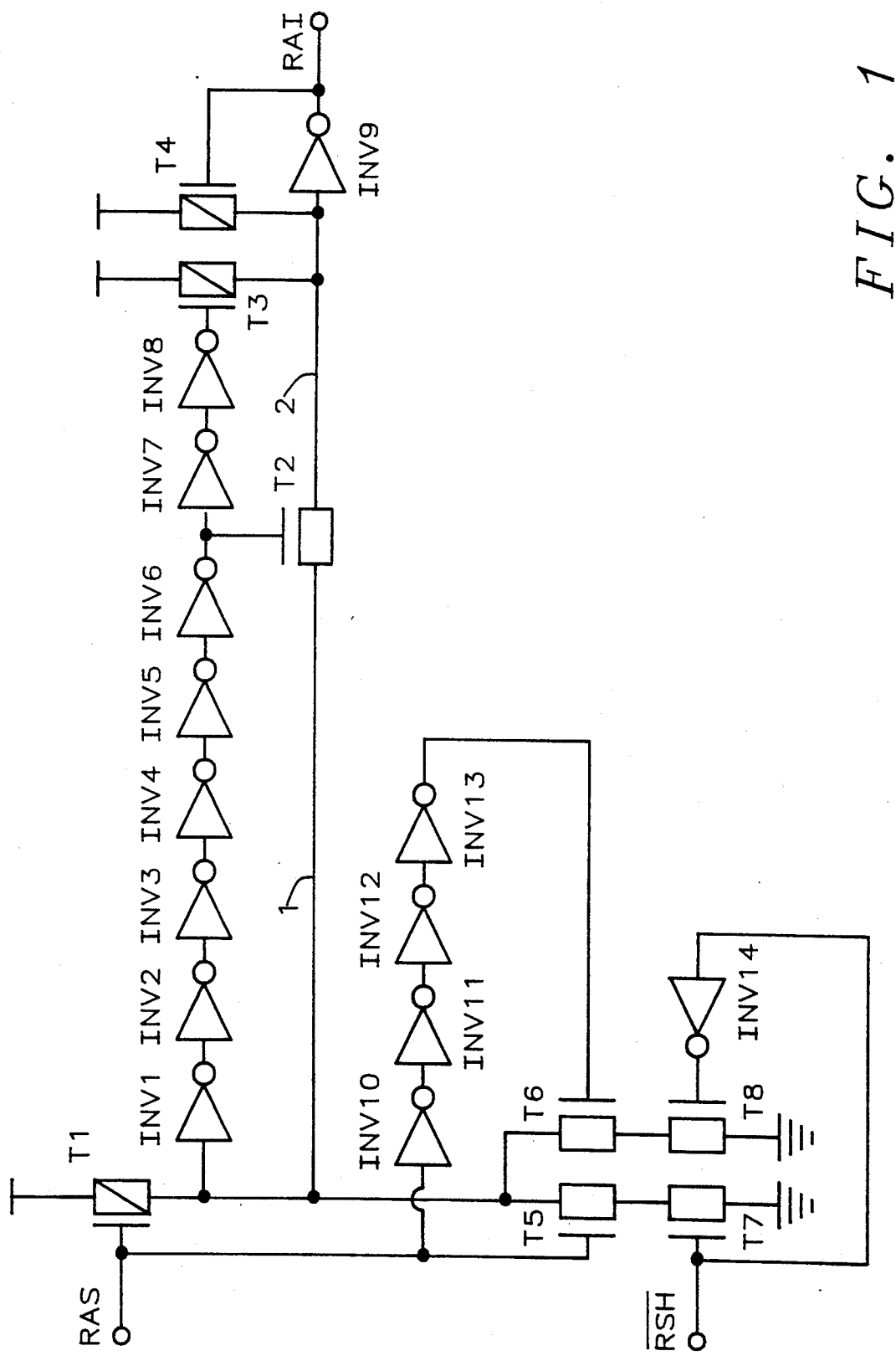
FIG. 1 is a schematic drawing of the preferred embodiment of the pulse forming circuit of this invention.

FIG. 1 shows an output line where the circuit produces the pulse RAI. The circuit receives two external inputs, RAS and $\overline{RSH}$ on two input lines. The memory support circuits raise RAS at an appropriate point in each memory cycle in either normal mode or refresh. This circuit raises RAI a selected time after the rise of RAS (row address set or row address select).

Figure 2:
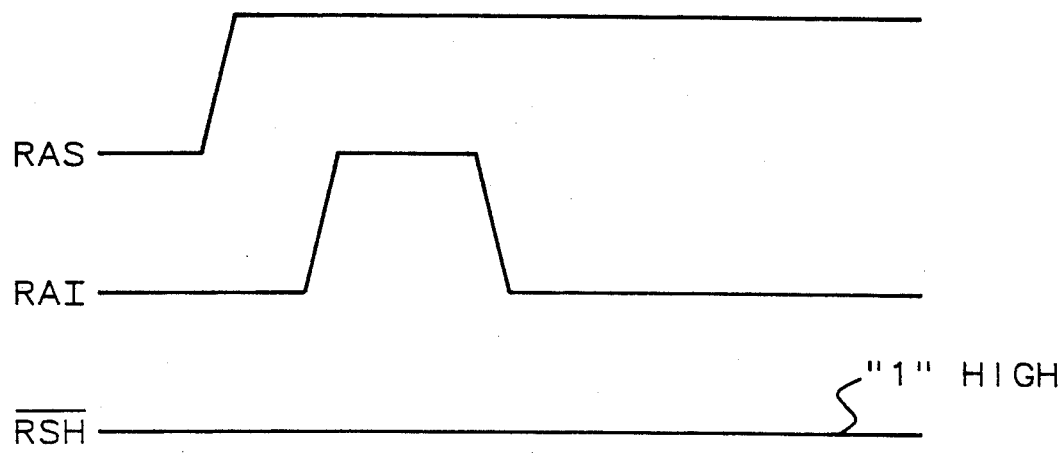
FIG. 2 shows the waveforms of the output and two inputs of the circuit of FIG. 1 for a normal memory operation (fetch or store).
Figure 3:
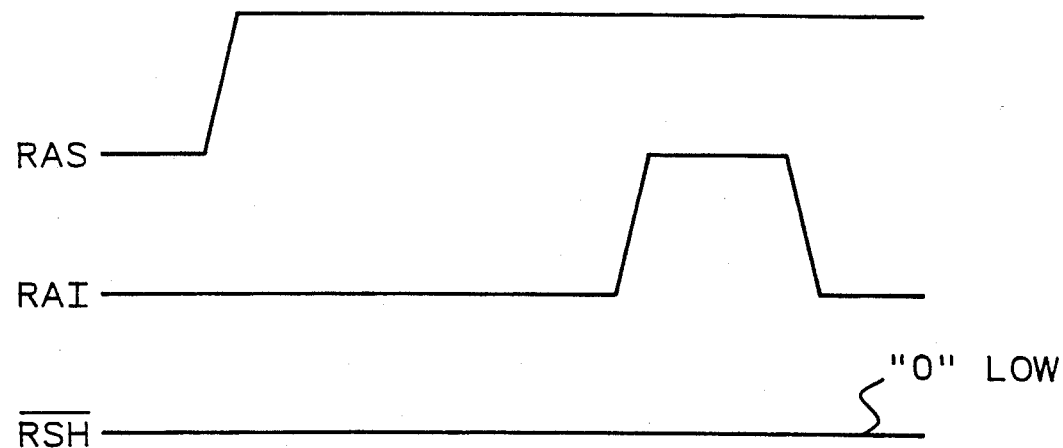
FIG. 3 shows the waveforms of FIG. 2 for a memory refresh operation.

RAS is down at the beginning of FIGS. 2 and 3 and then rises to initiate the pulse forming operation of this circuit. FIGS. 2 and 3 show RAS rising at corresponding times in both modes, but the circuit is not limited to this operation. From a more general standpoint, RAS is a signal that initiates the pulse forming circuit of this invention.

The selected delay between RAI and RAS has a shorter value when the external circuit is in normal mode and a longer value when the circuit is in refresh mode. An external signal RSH (refresh) defines the two modes. It is down for normal operations and up for refresh. The circuit receives the complement signal, $\overline{RSH}$, which is high in normal mode and low in refresh. Note that the terms "up" and "down" are a generalization of the polarities of the circuit power supply and the conductivity types of the FETs.

The memory support circuits raise $\overline{RSH}$ for a normal operation and drop it for a refresh operation. $\overline{RSH}$ is switched at times that are not relevant to this circuit and its transition is not shown in FIGS. 2 and 3. From a more general standpoint, $\overline{RSH}$ is a binary signal that establishes one of two time intervals between the rise of RAS and the rise of the output pulse, RAI.

The node charging components

At a time after the operations shown in FIGS. 2 and 3, the memory support circuits drop RAS. In response to the down level of RAS, p-channel FET (PMOS) T1 turns on and establishes an up level at its drain terminal, which is designated Node1. The up level signal at Node1 propogates through two segments of a delay circuit. Preferably the delay is formed by a chain of inverter circuits, and inverter circuits INV1 to INV6 form the first segment and inverter circuits INV7 to INV8 form the second segment.

A p-channel FET T3 has its gate connected to the output of the second delay segment. The source of T3 is connected to VDD (the positive power supply, terminal) and its drain is connected to a point designated Node2. When a down level pulse has propogated to the gate of T3, T3 turns on and pulls up Node2. When an up level pulse has propagated to the gate of T3, T3 turns off and pulls down Node 2. At this time, Node 1 is held up by T4.

The interconnection point of the two segments is designated Node3. Note that both segments have an even number of inverter stages; consequently, the two outputs of the delay segments (Node3 and the gate of T3) have the same binary value (up or down) as Node1 except while a pulse is propogating along the delays.

The output amplifier

An inverting amplifier INV9 has its input connected to Node2 and its output connected to the circuit output. P-channel FETs T3 and T4 each has its source terminal connected to VDD and its drain terminal connected to the amplifier input at Node2. Either FET T3 or FET T4 can pull up Node2 to drop the output pulse RAI. At the beginning of the operations shown in FIGS. 2 and 3, pulse RAI is down (as will be explained), and T4 is turned on and pulls up Node2. (The connection to the gate terminal of FET T3 will be described later.)

Note that n-channel FET T2 has its source terminal connected to Node1, its gate terminal connected to Node3, and its drain terminal connected to Node2. FET T2 can pull down Node2 in series circuit with FETs T5 and T7 or T6 and T8, as will be explained later. At the beginning of the operations shown in FIGS. 2 and 3, all three terminals of FET T2 are high.

The components that respond to $\overline{RSH}$

Notice that $\overline{RSH}$ is applied to the gate of an FET T7 and that an inverter 14 forms the complement (RSH) at the gate of an FET T8. Thus, T7 is enabled to conduct during normal operations and T8 is enabled to conduct during refresh. An FET T5 is connected in the drain circuit of T7 and an FET T6 is similarly connected in the drain circuit of T8. Thus, T5 is enabled to conduct during normal operations and T6 is enabled to conduct during refresh. T5 has its gate connected to the input line for RAS and in normal mode T5 turns on substantially immediately when RAS rises. (See FIG. 2.)

T6 has its gate connected to the input line for RAS through a delay circuit of inverters Inv10, Inv11 Inv12 and Inv13. This delay circuit establishes the delay between the rise of RAS and the rise of RAI shown in FIG. 3.

The drain terminals of T5 and T6 are connected together at Node1. When RAS rises in normal mode ($\overline{RSH}$ is up and T7 is enabled for conduction), T5 turns on and discharges Node1. When RAS rises in refresh mode ($\overline{RSH}$ is down and T8 is enabled for conduction), T6 turns on and discharges Node1 after the predetermined delay of the inverter chain.

Operation—Normal Mode (FIG. 2)

Recall that the beginning of this operation, FET T1 is on, FET T2 is not conducting, but its drain and gate terminals (Node2 and Node3) are high, FET T3 is off, FET T4 is on, Node1, Node2 and Node3 are high, and the circuit output RAI is low.

When RAS rises, FET T1 turns off to isolate Node1 from the power supply terminal VDD. The rise of RAS turns on T5, and the series combination of T5 and T7 discharges Node1 to ground. Node2 and Node3 momentarily remain isolated from Node1 as will be explained) and they hold their up levels As Node1 is discharged, the source terminal of FET T2 becomes negative with respect to its gate terminal (Node3) and drain terminal (Node2). Accordingly, FET T2 turns on and discharges Node2 and thereby turns on the inverting amplifier to raise pulse RAI.

When the inverting amplifier INV9 turns on, FET T4 turns off in response to the up level at its gate. When the down level pulse at Node1 reaches the gate terminal of T2 through delay elements Inv1-Inv6, FET T2 turns off in response to the down level at its gate terminal, and it thereby isolates Node2 from ground. Node2 remains down and the output pulse RAI remains high. The down level at Node3 propogates through the second delay segment, Inv7-Inv8, to the gate terminal of FET T3 and turns on FET T3. The conduction of T3 raises Node2 and thereby causes the inverting amplifier to drop the output pulse RAI. When the output pulse RAI falls, its down level turns on p-channel FET T4, which pulls up Node2 to keep the inverting amplifier turned off until the next cycle, as already explained.

Operation—Refresh Mode (FIG. 3)

Recall that in refresh mode, T7 is off and T8 is on. Thus, the operation to raise pulse RAI begins when Node1 is discharged through the series combination of FETs T8 and T6. When RAS rises, it propogates to the gate terminal of FET T6 through a delay circuit formed by inverters Inv10-Inv13. This delay causes T6 FIG. 3) to turn on later with respect to the rise of RAS than T5 (FIG. 2). When T6 turns on, the pulse forming operation proceeds in the way described for normal memory mode.

Other embodiments

Those skilled in the art will recognize various applications for this circuit and appropriate modifications, within the intended scope of the claims.

What is claimed is:

1. A circuit for forming an output pulse (RAI) rising in response to the presence of a binary valued initiating pulse (RAS) and falling a predetermined time thereafter, comprising:
   a first node (Node1) and a second node (Node2) and means (T1, T4) for charging the first and second nodes in a predetermined polarity in the absence of the initiating pulse (RAS),
   an inverter circuit (INV9) having its input coupled to the second node and having its output connected to produce the output pulse (RAE) in response to the voltage at the second node,
   a third node and means (T2) interconnecting the first and second nodes for selectively discharging the second node through the first node and means (T2, T5, T7) responsive to the presence of the initiating pulse for discharging the first and second nodes,
   a third node (Node3) and a first delay segment (Inv-1-Inv6) connected between the first node and the third node and providing a timing signal at the third node, and a second delay segment (Inv-7-Inv8) having its input end coupled to the second node and forming a timing signal at its output end,
   the means (T2) interconnecting the first and second nodes being responsive to the timing signal at the third node (Node3) for isolating the second node from the first node before the fall of the output pulse, and
   means (T3) connected to respond to the signal at the output end of the second delay segment and connected to the input of the inverter circuit for charging the second node and thereby causing the inverting circuit to drop the output pulse.

2. The circuit for forming an output pulse of claim 1 wherein the means interconnecting the first and second nodes comprising an FET having its gate terminal connected to the third node, and its source terminal and its drain terminal connected between the first node and the second node respectively.

3. The circuit for forming an output pulse of claim 2 wherein the timing signal at the third node has the polarity of the node charging voltage.

4. The circuit for forming an output pulse of claim 2 wherein the means for charging the first node comprises an FET having its gate terminal connected to receive the initiating pulse.

5. The circuit for forming an output pulse of claim 3 wherein FET for charging the first node has its drain terminal connected to the first node.

6. The circuit for forming an output pulse of claim 3 wherein the circuit includes a power supply having power supply terminals and wherein the means for charging the second node includes an FET (T4) connected to conduct between the second node and a power supply terminal and having its gate connected to the circuit output to turn on in response to the absence of the output pulse.

7. The circuit for forming an output pulse of claim 6 wherein the means for connecting the output end of the second delay segment to the input of the inverter circuit comprises an FET (T3) having its gate terminal connected to the other end of the second delay segment and having its source and drain terminals connected between the power supply terminal and the second node respectively.

8. The circuit for forming an output pulse of claim 7 wherein the means for discharging the first and second nodes comprises two FETs connected in series circuit between the first node and ground for discharging the first node when both FETs are turned on, one FET (T7) being connected to turn on in response to a signal $\overline{RSH}$ defining in one binary state an operating mode requiring the rise of the output pulse substantially immediately after the initiating pulse and the other FET (T5) being connected to turn on in response to the initiating pulse.

9. The circuit for forming an output pulse of claim 8 wherein the means for discharging the first and second nodes further comprises a delay circuit (INV-10-INV13) and a second series connection of two FETs, one FET (T8) being connected to turn on in response to the signal (RSH) defining an operating mode requiring the rise of the output pulse the predetermined delay after the initiating pulse, and the other FET (T6) being connected to turn on in response to the delayed signal, whereby the discharging of the first and second nodes and the consequent rise of the output pulse is delayed in response to the mode signifying signal.

10. The circuit for forming an output pulse of claim 9 wherein the first delay segment and the second delay segment each comprise a chain of inverter circuits.

11. A circuit for forming a memory addressing pulse (RAI) in a memory of the type that produces a binary valued signal $\overline{RSH}$ defining in one state a refresh operation requiring a predetermined delay between the rise of an initiating signal (RAS) and the rise of the memory addressing pulse and defining in the complement state a normal memory operation not requiring the delay, comprising:

first and second terminals for connection to a power supply, a first node (Node1) and a second node (Node2) and means (T1, T4) for charging the first and second nodes respectively from the first power supply terminal in the absence of the initiating pulse (RAS), an inverter circuit (INV9) having its input coupled to the second node and having its output coupled to produce the memory addressing pulse (RAI) in response to the voltage at the second node, means (T2) interconnecting the first and second nodes for selectively discharging the second node through the first node and means (T2, T5, T7) coupled to the first node and responsive to the presence of the initiating pulse for discharging the first and second nodes to the second power supply terminal and thereby raising the memory addressing pulse, a third node (Node3) and a first delay segment (Inv-1-Inv6) connected between the first node and the third node and providing a timing signal at the third node, and a second delay segment (Inv-7-Inv8) having its input end connected to the second node and forming a timing signal at its output end, said means (T2) interconnecting the first and second nodes being responsive to the timing signal at the third node (Node3) for isolating the second node from the first node after the rise of the memory addressing pulse and preparatory for the fall of the memory address pulse, and means (T3) connected to respond to the signal at the output end of the second delay segment and connected to the input of the inverter circuit for charging the second node and thereby causing the inverting circuit to drop the memory addressing pulse.

12. The circuit for forming a memory addressing pulse of claim 11 wherein the means responsive to the timing signal at the third node comprises an FET (T2) having its gate terminal connected to the third node, its source terminal connected to the first node and its drain terminal connected to the second node respectively.

13. The circuit for forming a memory addressing pulse of claim 12 wherein the means for charging the second node includes an FET (T4) connected between the second node and a power supply terminal and having its gate connected to the circuit output to turn on in response to the absence of the memory addressing pulse.

14. The circuit for forming a memory addressing pulse of claim 13 wherein the means for discharging the first and second nodes comprises the series connection of two FETs, one FET (T7) being connected to turn on in response to a signal $\overline{RSH}$ defining in one binary state an operating mode requiring the rise of the memory addressing pulse substantially immediately after the initiating pulse and the other FET (T5) being connected to turn on in response to the initiating pulse and thereby discharge the nodes.

15. The circuit for forming a memory addressing pulse of claim 14 wherein the means for discharging the first and second nodes further comprises a delay circuit (Inv10-Inv13) and a second series connection of two FETs, one FET (T8) being connected to turn on in response to a signal (RSH) signifying an operating mode requiring the rise of the memory addressing pulse the predetermined delay after the initiating pulse, and the other FET (T6) being connected to turn on in response to the delayed signal at the output of the delay circuit, whereby the discharging of the first and second nodes and the consequent rise of the memory addressing pulse is delayed in response to the mode defining signal.

* * * * *